(12) United States Patent
Ma

(10) Patent No.: US 8,261,908 B2
(45) Date of Patent: Sep. 11, 2012

(54) CONTAINER FOR PRECURSORS USED IN DEPOSITION PROCESSES

(75) Inventor: Ce Ma, San Diego, CA (US)

(73) Assignee: Linde Aktiengesellschaft, Munich (DE)

( * ) Notice: Subject to any disclaimer, the term of this patent is extended or adjusted under 35 U.S.C. 154(b) by 803 days.

(21) Appl. No.: 12/328,982

(22) Filed: Dec. 5, 2008

(65) Prior Publication Data
US 2010/0140120 A1    Jun. 10, 2010

(51) Int. Cl.
*B65D 25/04* (2006.01)
(52) U.S. Cl. .......... 206/219; 118/726; 432/219
(58) Field of Classification Search .......... 118/726, 118/715; 206/219; 432/206, 217, 218, 219, 432/9
See application file for complete search history.

(56) References Cited

U.S. PATENT DOCUMENTS

| | | | | |
|---|---|---|---|---|
| 5,425,183 A | * | 6/1995 | Taylor | 34/73 |
| 5,472,119 A | * | 12/1995 | Park et al. | 222/145.8 |
| 5,679,164 A | * | 10/1997 | Baik et al. | 118/715 |
| 6,837,251 B1 | | 1/2005 | Zorich et al. | |
| 7,484,372 B2 | * | 2/2009 | Lee | 62/51.1 |
| 2006/0072281 A1 | | 4/2006 | Nam et al. | |
| 2006/0269667 A1 | | 11/2006 | Ma et al. | |
| 2010/0140120 A1 | * | 6/2010 | Ma | 206/219 |

OTHER PUBLICATIONS

International Search Rpt, Jan. 21, 2010.

* cited by examiner

*Primary Examiner* — Sylvia R. MacArthur
(74) *Attorney, Agent, or Firm* — David A. Hey

(57) ABSTRACT

Precursor source containers to hold precursor materials used in thin film deposition processes, such as ALD and MOCVD methods are described. In particular, the container holds both a liquid precursor or a dissolved precursor solution and a rinse solvent in separate chambers, and reduces the overall space requirement. In one embodiment, a cylinder within a cylinder arrangement provides two separate chambers, one for the precursor solution and the other for the rinse solvent.

12 Claims, 3 Drawing Sheets

CONTAINER FOR PRECURSORS USED IN DEPOSITION PROCESSES

FIELD OF THE INVENTION

The present invention relates to new and useful containers for precursor materials used as source materials in atomic layer deposition (ALD) or metalorganic chemical vapor deposition (MOCVD) processes and to methods related thereto.

BACKGROUND OF THE INVENTION

Atomic layer deposition (ALD) is an enabling technology for next generation conductor barrier layers, high-k gate dielectric layers, high-k capacitance layers, capping layers, and metallic gate electrodes in silicon wafer processes. ALD has also been applied in other electronics industries, such as flat panel display, compound semiconductor, magnetic and optical storage, solar cell, nanotechnology and nano materials. ALD is used to build ultra thin and highly conformal layers of metal, oxide, nitride, and others up to one monolayer at a time in a cyclic deposition process. Oxides and nitrides of many main group metal elements and transition metal elements, such as aluminum, barium, cerium, dysprosium, hafnium, lanthanum, niobium, silicon, strontium, tantalum, titanium, tungsten, yttrium, zinc and zirconium have been produced by ALD processes using oxidation or nitridation reactions. Pure metallic layers, such as Ru, Cu, Ti, Ta, W, and others may also be deposited using ALD processes through reduction or combustion reactions.

A typical ALD process is based on sequential applications of at least two precursors to the substrate surface with each pulse of precursor separated by a purge. Each application of a precursor is intended to result in up to a single monolayer of material being deposited on the surface. These monolayers are formed because of the self-terminating surface reactions between the precursors and surface. In other words, reaction between the precursor and the surface should proceed until no further surface sites are available for reaction. Excess precursor will not react with same type of precursor that has already reacted at the surface site and the excess precursor is then purged from the deposition chamber. Following the purge, the second precursor is introduced and reacts with the first precursor on the surface. Any excess second precursor is purged after surface saturation. Each precursor pulse and purge sequence comprises one ALD half-cycle that theoretically results in up to a single additional monolayer of material. Because of the self-terminating nature of the process, even if more precursor molecules arrive at the surface, no further reactions will occur. It is this self-terminating characteristic that provides for high uniformity, conformality and precise thickness control when using ALD processes.

Chemical vapor deposition (CVD) is a chemical process used to produce high-purity, high performance solid materials, particularly in the semiconductor and microelectronic industries for the production of thin films with greater growth rates than ALD processes. A typical CVD process comprises exposing a wafer to one or more volatile precursor materials that react or decompose on the wafer surface to produce the desired layer deposit continuously. Volatile by-products are usually produced that must be removed by gas flow through the reaction chamber. CVD is used in a wide variety of forms, including metalorganic chemical vapor deposition (MOCVD) to deposit materials such as monocrystalline, polycrystalline, amorphous and epitaxial layers of silicon, carbon fiber, carbon nanofibers, filaments, carbon nanotubes, silicon dioxide, silicon germanium, tungsten, silicon carbide, silicon nitride, silicon oxynitride, titanium nitride, high-k dielectrics, etc. MOCVD techniques are based upon the use of metalorganic precursor materials for the formation of the desired layers.

There are a wide variety of precursor materials that can be used in ALD and MOCVD processes. For example, new solution based precursors have been proposed in Published US patent application 2006-0269667, hereby incorporated in its entirety by reference. These solution based precursors allow greater choice in precursor materials and because they are comprised of a dissolved metal precursor in a solvent mixture, can also enhance chemical utilization and reduce costs.

In particular, disclosed in the above published patent application are precursor solutions comprised of one or more low volatility precursors (including solid precursors) dissolved in a solvent. For example, the precursor may be a halide, alkoxide, β-diketonate, nitrate, alkylamide, amidinate, cyclopentadienyl, or other organic or inorganic metal or non-metal compound. More specifically, the precursor may be $Hf[N(Et-Me)]_4$, $Hf(NO_3)_4$, $HfCl_4$, $HfI_4$, $[(t-Bu)Cp]_2HfMe_2$, $Hf(O_2C_5H_{11})_4$, $Cp_2HfCl_2$, $Hf(OC_4H_9)_4$, $Hf(OC_2H_5)_4$, $Al(OC_3H_7)_3$, $Pb(OC(CH_3)_3)_2$, $Zr(OC(CH_3)_3)_4$, $[(t-Bu)Cp]_2ZrMe_2$, $Ti(OCH(CH_3)_2)_4$, $[(t-Bu)Cp]_2TiMe_2$, $[(i-Prop)Cp]_3La$, $Ba(OC_3H_7)_2$, $Sr(OC_3H_7)_2$, $Ba(C_5Me_5)_2$, $Sr(C_5i-Pr_3H_2)_2$, $Ti(C_5Me_5)(Me_3)$, $Ba(thd)_2*triglyme$, $Sr(thd)_2*triglyme$, $Ti(thd)_3$, $RUCP_2$, $Ta(NMe_2)_5$ or $Ta(NMe_2)_3(NC_9H_{11})$. The concentration of the precursor in the precursor solution is generally from 0.01 M to 1 M and the precursor solution may include stabilizing additives with concentrations from 0.0001 M to 1 M, such as oxygen containing organic compounds, e.g. THF, 1,4-dioxane, or DMF. The solvent used has a boiling point selected to ensure no solvent loss during vaporization. In particular, the solvent may be dioxane, toluene, n-butyl acetate, octane, ethylcyclohexane, 2-methoxyethyl acetate, cyclohexanone, propylcyclohexane, 2-methoxyethyl ether (diglyme), butylcyclohexane or 2,5-dimethyloxytetrahydrofuran. Specifically disclosed precursor solutions include aluminum i-propoxide dissolved in ethylcyclohexane or octane; $[(t-Bu)Cp]_2HfMe_2$ dissolved in ethylcyclohexane or octane; Tetrakis(1-methoxy-2-methyl-2-propoxide)hafnium (IV) dissolved in ethylcyclohexane or octane; hafnium tert-butoxide or hafnium ethoxide dissolved in ethylcyclohexane or octane; a mixture of $Ba(O-iPr)_2$, $Sr(O-iPr)_2$, and $Ti(O-iPr)_4$ dissolved in ethylcyclohexane or octane; and $RuCp_2$ dissolved in dioxane, dioxane/octane or 2,5-dimethyloxytetrahydrofuran/octane.

Further solution based precursors are disclosed in pending U.S. patent application Ser. No. 12/261,169, hereby incorporated in its entirety by reference. This application discloses precursors comprising lanthanum alkyl cyclopentadienyl compounds. Specific examples of such compounds include lanthanum(III)isopropoxide; tris(N,N-bis(trimethylsilyl)amide)lanthanum; tris(cyclopentadienyl)lanthanum; or tris(isopropyl-cyclopentadienyl)lanthanum.

These solution based precursors are delivered by direct liquid injection (DLI) methods, which means the precursor liquid can remain at ambient temperature, thereby providing long stability and dosage control. The solution precursor is vaporized in a vaporizer before deliver to the process chamber. When a standard liquid precursor container is used as the container for the source material precursors, the liquid material is pushed into the DLI system through a dip-tube by head-space gas pressure. The liquid precursor in pure chemical form or the dissolved metal precursor in solution form might disadvantageously interact with downstream DLI metal surfaces, such as particle filters, liquid mass flow controllers, valves, and pipes to form thin film layers on the surfaces thereof. If such interaction occurs, particles could form from the adsorbed metal complex when the DLI system pressure and temperature change. In addition, air and moisture contamination during the source change or system service may promote unwanted surface reactions to form thin film or particles. This thin film and particle formation leads to problems with the DLI system, particularly, making it difficult to control liquid flow, and eventually causing system clogging.

The source condensed film or absorbed metal organic precursors cannot be purged out of the system with inert gases and vacuum cycles because of the surface bonding that occurs. Therefore, removal of surface molecules generally requires washing and dissolving in a cleaning solvent before purge with air or moisture. Such a system requires additional piping be included in the standard DLI system or disconnection of the precursor source container to enable cleaning.

Therefore, there remains a need in the art for improvements to the use of liquid based precursors in ALD and MOCVD processes.

SUMMARY OF INVENTION

The present invention provides new and useful containers for precursor materials that are used as source materials in ALD or MOCVD processes. In particular, one solution to alleviate problems related to the build up of thin films or particles in the DLI system is to perform pre-cleaning and post-cleaning of the DLI system using a rinse by a solvent or solvent mixture that is the major component of the solution-based precursor material. Such a solvent or solvent mixture can re-dissolve surface adsorbed metal complexes in the DLI system. The solvent or solvent mixture can also be used to clean absorbed metalorganic precursors from downstream surfaces when using pure ALD or MOCVD precursor sources.

However, because of limited working space, the use of a source container, additional piping and a separate container for holding rinse solvent, is impractical. Therefore, the present invention provides a new container for holding both the precursor liquid and the rinse solvent that will fit within the available space.

DETAILED DESCRIPTION OF THE INVENTION

Figure 1:
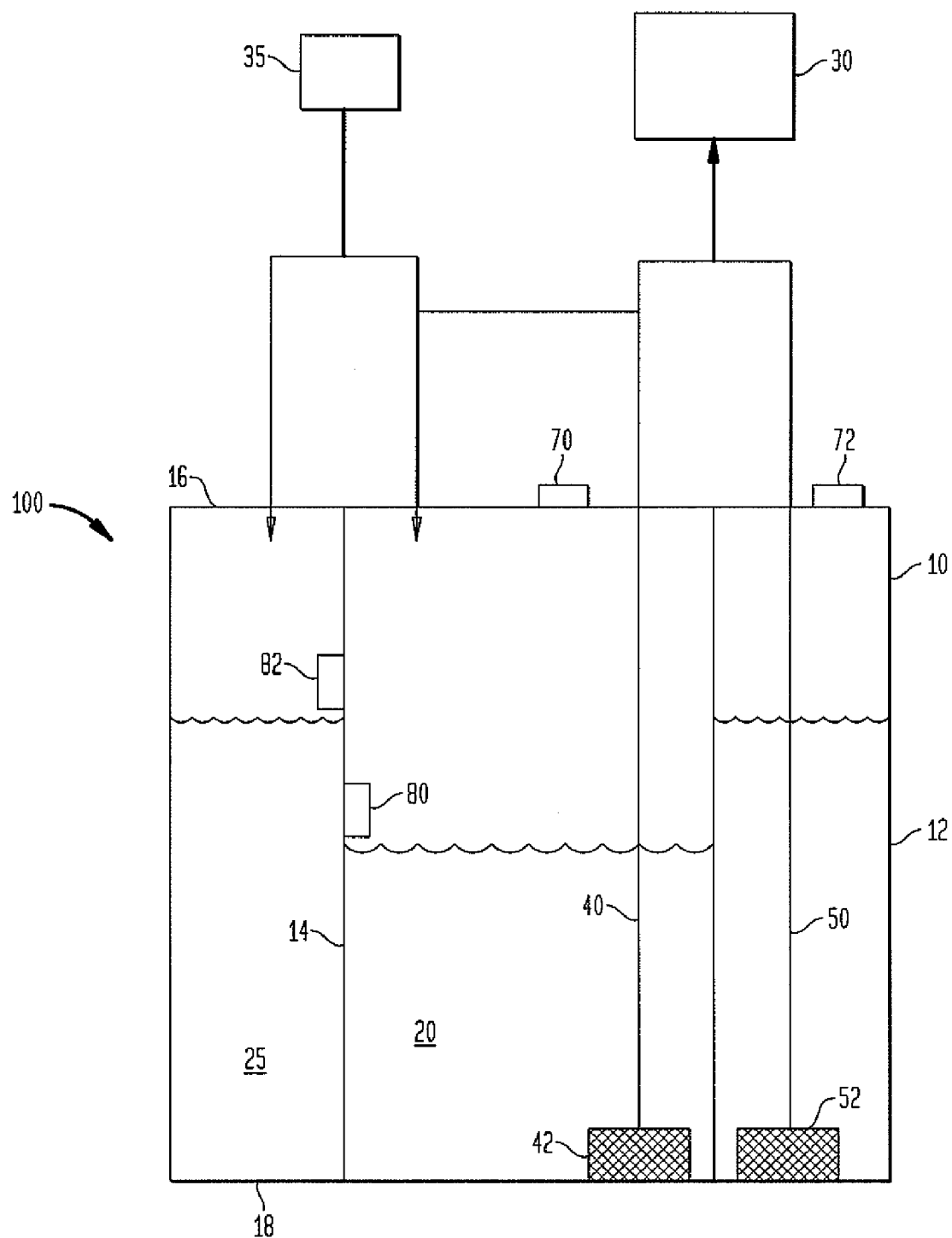
FIG. 1 is a cut away plan view of a container for precursor source material and solvent rinse in accordance with one embodiment of the present invention.

The present invention will be described in detail with reference to the drawing figures. In particular, FIG. 1, is a schematic view of the container system according to a first embodiment of the present invention, and shows a container system 100, that holds both a precursor source solution and a solvent rinse separately. The system 100, includes a container 10, having two separate chambers defined by an outer wall 12, and an inner wall 14. The container 10, can be of any desirable shape or size, but preferably is cylindrical in shape and sized to fit within the existing space of a fabrication area. For example, the outer wall 12, may be defined by a first cylinder of a first diameter and the inner wall 14, may be defined by a second cylinder having a second diameter smaller than that of the first cylinder, such that the second cylinder fits concentrically or in an offset manner within the first cylinder. The two cylinders are welded to two planer circular disks having a diameter equal to the diameter of the first cylinder and arranged so as to provide a top 16, and bottom 18, for the container 10.

By constructing the container 10, in the manner described above, two chambers are formed. In FIG. 1, the innermost chamber is used to contain a liquid precursor or precursor solution 20 (hereinafter referred to as precursor solution 20) and the outermost chamber contains solvent rinse 25. The volume ratio of precursor solvent rinse to precursor solution can range from ten percent (10%) up to one hundred percent (100%) depending on the desired manufacturing application. It is also possible to reverse the location of the solutions, i.e. the precursor solution can be in the outermost chamber and the solvent rinse in the innermost chamber.

Either of the precursor solution 20, or the solvent rinse 25, can be delivered to a DLI system 30, through the use of dip tubes and the maintenance of head pressure within the two chambers of the container 10. In particular, a precursor solution dip tube 40, equipped with an optional particle filter 42, is located in the inner chamber of the container 10, submerged within the precursor solution 20. Further, a rinse solvent dip tube 50, equipped with an optional particle filter 52, is located in the outer chamber of container 10, and submerged within the rinse solvent 25. The precursor solution dip tube 40, and the rinse solvent dip tube 50, each provide their respective solutions to the DLI system 30, through appropriate piping and valves. In particular, a three way valve system can be employed so that the supply of appropriate solution can be switched as needed for processing, i.e. precursor solution 20, will be supplied to the DLI 30, during a deposition stage, and rinse solvent 25, will be supplied to the DLI 30, during a cleaning stage. Optional check valves can be included for added control and to prevent back flow to the container 10. The dip tubes, connection piping and valves can be constructed of any inert material, preferably electro-polished stainless steel.

Head pressure is maintained within the two chambers of the container 10, by providing an inert gas to the head space in each chamber. In particular, an inert gas source 35, provides inert gas, such as nitrogen, argon or helium, through appropriate piping and valves to the head space of both the inner chamber and the outer chamber of the container 10. Optional check valves can be used to prevent back-flow of the solutions. Alternatively, a three way valve can be employed to isolate separate ports for introduction of the inert gas to the head space areas. In addition, a connection can be provided between the piping and valve system for delivery of the solutions to the DLI 30, and the piping and valve system for delivery of the inert gas. This connection allows inert gas to be supplied to the DLI 30, as a purge gas. In addition, cleaning solution can be provided through this connection for cleaning of the system. The connection piping and valves can be constructed of any inert material, preferably electro-polished stainless steel.

The container 10, is also provide with filler ports 70, 72, that allow for additional solution to be provided to the different chambers of the container 10. In particular, additional precursor solution can be added to the inner chamber through filler port 70, and additional rinse solvent can be added to the outer chamber through filler port 72. Optionally, each chamber of the container 10, can have a level sensor to measure the liquid level of the solution in the chamber. In particular, level sensor 80, can be used to measure the liquid level of the precursor solution in the inner chamber, and level sensor 82, can be used to measure the liquid level of the rinse solvent in the outer chamber.

Figure 2:
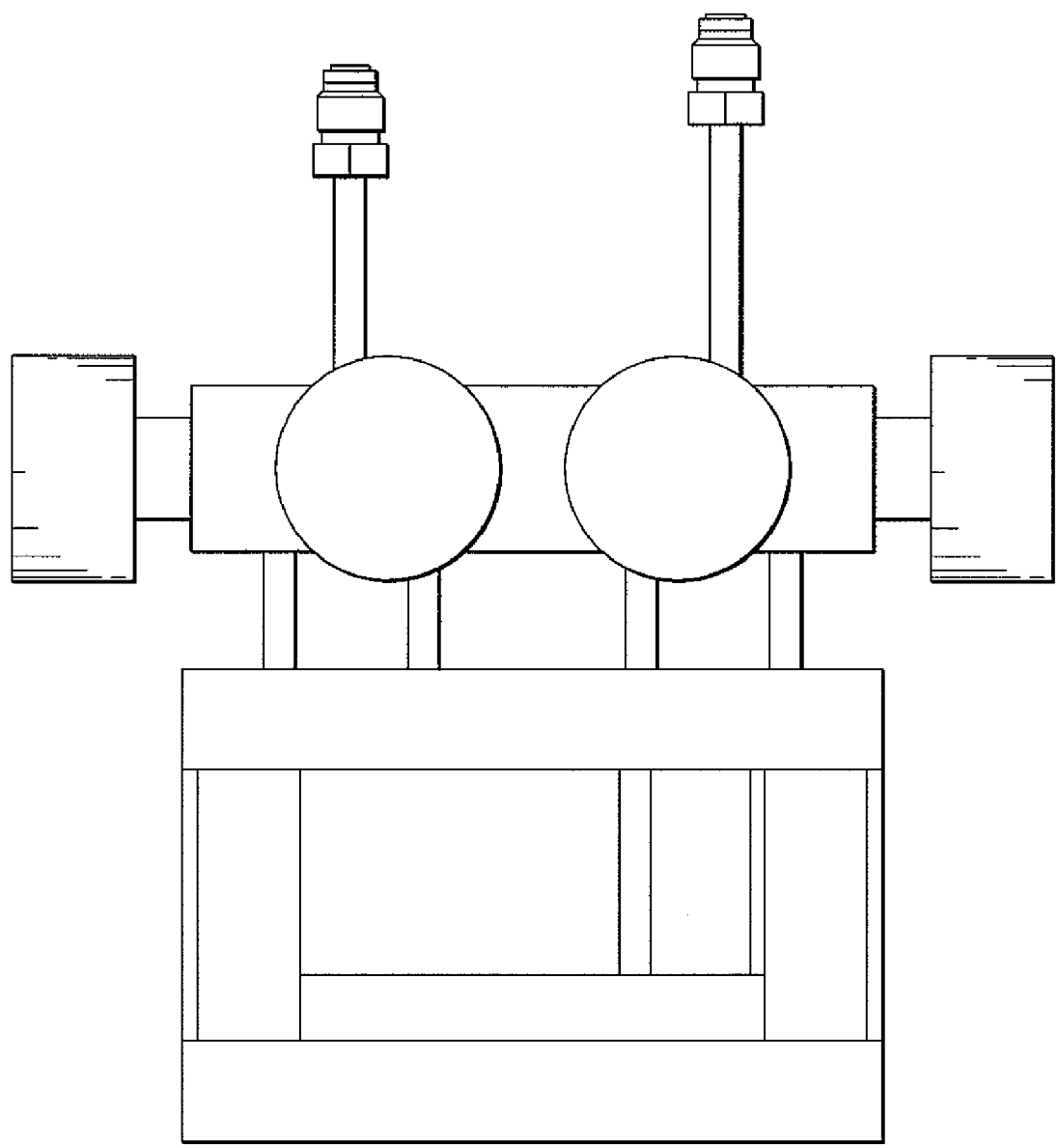
FIG. 2 is a three dimensional view of a container for precursor source material and solvent rinse in accordance with one embodiment of the present invention.
Figure 3:
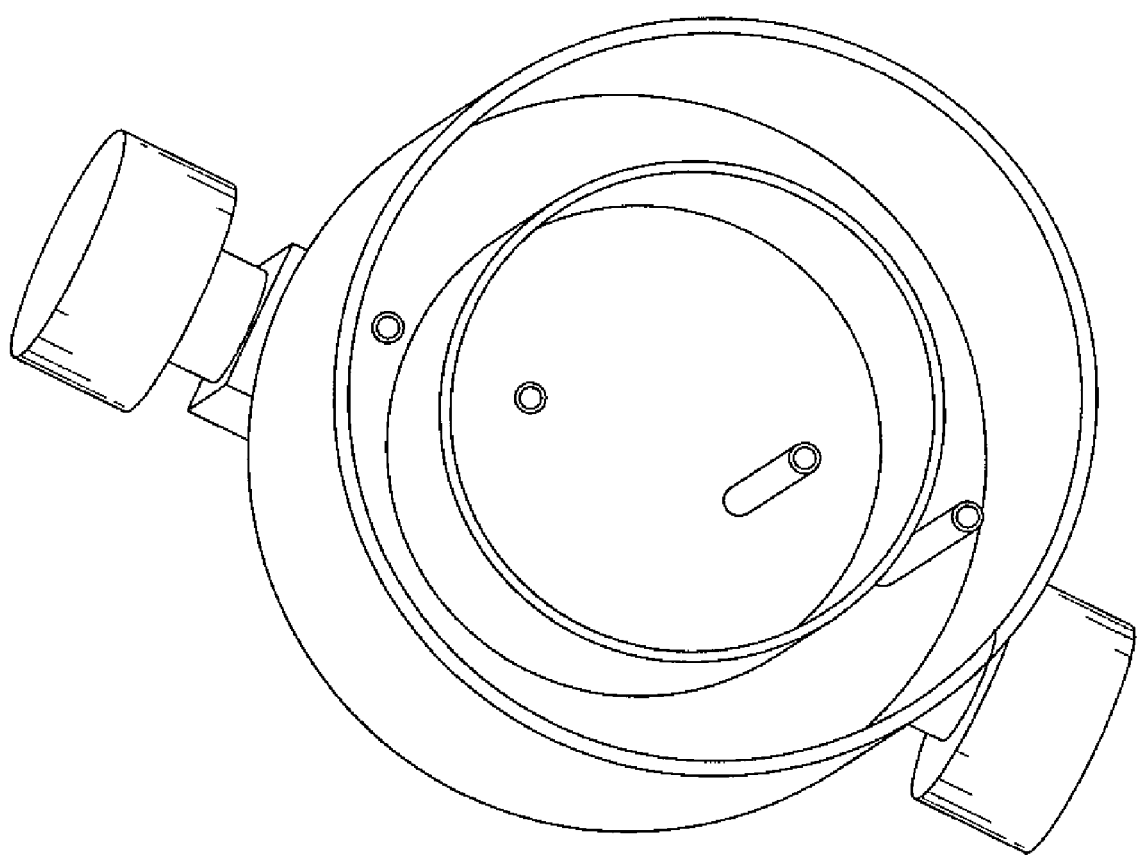
FIG. 3 is a three dimensional cut away view showing the interior of a container for precursor source material and solvent rinse in accordance with one embodiment of the present invention.

FIGS. 2 and 3 show further views of the container according to the present invention. In particular, FIG. 2 is a three dimensional view showing the container for precursor source material and solvent rinse according to the present invention. FIG. 3 is another three dimensional view that has been cut away to show the interior of the container for precursor source material and solvent rinse according to the present invention.

The system 100, of the present invention would operate as follows. Prior to deposition processing, the container would be filled with precursor solution 20, and rinse solvent 25. Desired liquid levels could be set by using the optional level sensors 80, 82. The head space in both chambers of the container 10, could then be pressurized by flowing inert gas from the inert gas source 35, into the two chambers through the piping and valves. The piping and valve system for the solutions would then be set to provide rinse solvent 25, from the rinse solvent dip tube 50, to the DLI system 30. This serves to pre-clean the DLI system 30. The piping and valve system would then be set to provide precursor solution 20, from the precursor solution dip tube 40, to the DLI system 30, for use in carrying out the desired deposition process. After the initial deposition stage, the system can again be rinsed with rinse solvent 25, by resetting the valves to provide rinse solvent 25, through the rinse solvent dip tube 50, to the DLI system 30. This rinse serves to re-dissolve any liquid precursor that has adhered to piping and other surfaces and then to remove such along with particles or thin films that may have built up from the precursor solution 20, during the deposition stage, from the system. The process can then continue in similar fashion, switching as desired between precursor solution 20, delivery and rinse solvent 25, delivery to the DLI system 30.

The system of the present invention provides several advantages. In particular, this system allows for the pre-cleaning of the DLI system using pure rinse solvent (or solvent mixture) before deposition processes begin. Further, calibration and check of liquid flow rates can be carried out using the rinse solvent. In addition, the DLI system can be cleaned at the end of the deposition process or when the chemistry or deposition process parameters change. The system of the present invention provides a compact design that minimizes the need for additional space and connection piping. Moreover, the system of the present invention includes minimum dead space that cannot be cleaned with rinse solvent.

It is anticipated that other embodiments and variations of the present invention will become readily apparent to the skilled artisan in the light of the foregoing description, and it is intended that such embodiments and variations likewise be included within the scope of the invention as set out in the appended claims. For example, many different piping and valve arrangements can be utilized without departing from the invention. Further, virtually any arrangement of the container and chambers within the container is possible. For example, a cylinder within cylinder arrangement that requires only a single inert gas feed for pressurization of the head space for both chambers is possible.

What is claimed:

1. A container for use in a deposition process, the container comprising an outer chamber and an inner chamber arranged concentrically, wherein one of the chambers is configured to hold liquid precursor solution and the other chamber is configured to hold rinse solution.

2. The container according to claim 1 wherein the deposition process is an atomic layer deposition process or a metalorganic vapor deposition process.

3. The container according to claim 1 wherein the liquid precursor solution is a halide, alkoxide, β-diketonate, nitrate, alkylamide, amidinate, cyclopentadienyl, or other organic or inorganic metal or non-metal compound dissolved in a solvent or a solvent mixture.

4. The container according to claim 3 wherein the solvent is dioxane, toluene, n-butyl acetate, octane, ethylcyclohexane, 2-methoxyethyl acetate, cyclohexanone, propylcyclohexane, 2-methoxyethyl ether(diglyme), butylcyclohexane or 2,5-dimethyloxytetrahydrofuran.

5. The container according to claim 1 wherein the liquid precursor solution is $Hf[N(EtMe)]_4$, $Hf(NO_3)_4$, $HfCl_4$, $HfI_4$, $[(t-Bu)Cp]_2HfMe_2$, $[(i-Prop)Cp]_3La$, $Hf(O_2C_5H_{11})_4$, $Cp_2HfCl_2$, $Hf(OC_4H_9)_4$, $Hf(OC_2H_5)_4$, $Al(OC_3H_7)_3$, $Pb(OC(CH_3)_3)_2$, $Zr(OC(CH_3)_3)_4$, $[(t-Bu)Cp]_2ZrMe_2$, $Ti(OCH(CH_3)_2)_4$, $[(t-Bu)Cp]_2TiMe_2$, $Ba(OC_3H_7)_2$, $Sr(OC_3H_7)_2$, $Ba(C_5Me_5)_2$, $Sr(C_5i-Pr_3H_2)_2$, $Ti(C_5Me_5)(Me_3)$, $Ba(thd)_2$*triglyme, $Sr(thd)_2$*triglyme, $Ti(thd)_3$, $RuCp_2$, $Ta(NMe_2)_5$ or $Ta(NMe_2)_3(NC_9H_{11})$ dissolved in a solvent or a solvent mixture.

6. The container according to claim 5 wherein the solvent is dioxane, toluene, n-butyl acetate, octane, ethylcyclohexane, 2-methoxyethyl acetate, cyclohexanone, propylcyclohexane, 2-methoxyethyl ether(diglyme), butylcyclohexane or 2,5-dimethyloxytetrahydrofuran.

7. The container according to claim 1 wherein the precursor solution is aluminum i-propoxide dissolved in ethylcyclohexane or octane; $[(t-Bu)Cp]_2HfMe_2$ dissolved in ethylcyclohexane or octane; $[(t-Bu)Cp]_2ZrMe_2$ dissolved in ethylcyclohexane or octane; $[(i-Prop)Cp]_3La$ dissolved in ethylcyclohexane or octane; Tetrakis(1-methoxy-2-methyl-2-propoxide)hafnium (IV) dissolved in ethylcyclohexane or octane; hafnium tert-butoxide or hafnium ethoxide dissolved in ethylcyclohexane or octane; a mixture of $Ba(O-iPr)_2$, $Sr(O-iPr)_2$, and $Ti(O-iPr)_4$ dissolved in ethylcyclohexane or octane; or $RuCp_2$ dissolved in dioxane, dioxane/octane or 2,5-dimethyloxytetrahydrofuran/octane.

8. The container according to claim 1 where in the precursor solution is a lanthanum alkyl cyclopentadienyl compound dissolved in a solvent.

9. The container according to claim 8 wherein the lanthanum alkyl cyclopentadienyl compound is lanthanum(III)isopropoxide; tris(N,N-bis(trimethylsilyl)amide)lanthanum; tris(cyclopentadienyl)lanthanum; or tris(isopropyl-cyclopentadienyl)lanthanum.

10. The container according to claim 1 wherein the outer chamber and the inner chamber have a cylindrical cross section.

11. The container according to claim 1 wherein the outer chamber holds the rinse solution and the inner chamber holds the liquid precursor solution.

12. The container according to claim 1 wherein the inner chamber holds the rinse solution and the outer chamber holds the liquid precursor solution.

* * * * *